United States Patent
Kim et al.

(10) Patent No.: US 6,769,084 B2
(45) Date of Patent: Jul. 27, 2004

(54) BUILT-IN SELF TEST CIRCUIT EMPLOYING A LINEAR FEEDBACK SHIFT REGISTER

(75) Inventors: Heon Cheol Kim, San Jose, CA (US); Jin-Young Park, Kyunggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 665 days.

(21) Appl. No.: 09/805,431

(22) Filed: Mar. 13, 2001

(65) Prior Publication Data
US 2002/0138800 A1 Sep. 26, 2002

(51) Int. Cl.[7] .......................... G06F 11/00; G06F 12/00; G01R 31/28
(52) U.S. Cl. ...................... 714/739; 714/743; 714/730; 711/200

(58) Field of Search ................. 714/733, 734, 714/735, 736, 743, 739, 726, 730, 728, 42, 54; 708/250, 252; 711/220, 200

(56) References Cited

U.S. PATENT DOCUMENTS

| 4,782,487 A | * | 11/1988 | Smelser ...................... 714/723 |
| 5,033,048 A | * | 7/1991 | Pierce et al. ................ 714/719 |
| 5,224,103 A | * | 6/1993 | Ligthart et al. ............. 714/732 |
| 5,706,293 A | * | 1/1998 | Kim et al. ................... 714/719 |

* cited by examiner

*Primary Examiner*—Christine T. Tu
(74) *Attorney, Agent, or Firm*—F.Chau & Associates, LLC

(57) ABSTRACT

A built-in self test (BIST) circuit and method is provided for testing semiconductor memory. A linear feedback shift register (LFSR) is used for addressing the memory locations to be tested. Test data is derived at least partially from the address data generated from the linear feedback shift register.

13 Claims, 11 Drawing Sheets

Fig. 4

| Bit | Primitive Polynomial | Bit | Primitive Polynomial |
|---|---|---|---|
| 1 | 0 | 19 | 6 5 1 0 |
| 2 | 1 0 | 20 | 3 0 |
| 3 | 1 0 | 21 | 2 0 |
| 4 | 1 0 | 22 | 1 0 |
| 5 | 2 0 | 23 | 5 0 |
| 6 | 1 0 | 24 | 4 3 1 0 |
| 7 | 1 0 | 25 | 3 0 |
| 8 | 6 5 1 0 | 26 | 8 7 1 0 |
| 9 | 4 0 | 27 | 8 7 1 0 |
| 10 | 3 0 | 28 | 3 0 |
| 11 | 2 0 | 29 | 2 0 |
| 12 | 7 4 3 0 | 30 | 16 15 1 0 |
| 13 | 4 3 1 0 | 31 | 3 0 |
| 14 | 12 11 1 0 | 32 | 28 27 1 0 |
| 15 | 1 0 | 33 | 13 0 |
| 16 | 5 3 2 0 | 34 | 15 14 1 0 |
| 17 | 3 0 | 35 | 2 0 |
| 18 | 7 0 | 36 | 11 0 |

Fig. 6A

1st ADB
(LFSR Free, all zero & all one)

| Memory Location | D | D' |
|---|---|---|
| 0 | 0000 | 1111 |
| 1 | 0000 | 1111 |
| 2 | 0000 | 1111 |
| 3 | 0000 | 1111 |
| 4 | 0000 | 1111 |
| 5 | 0000 | 1111 |
| 6 | 0000 | 1111 |
| 7 | 0000 | 1111 |

Fig. 6B

**2nd ADB
(using LFSR[2] bit value)**

| Memory Location | D | D' |
|---|---|---|
| 0 | 0000 | 1111 |
| 1 | 0000 | 1111 |
| 2 | 0000 | 1111 |
| 3 | 0000 | 1111 |
| 4 | 1111 | 0000 |
| 5 | 1111 | 0000 |
| 6 | 1111 | 0000 |
| 7 | 1111 | 0000 |

Fig. 6C

3rd ADB
(using LFSR[1] bit value)

| Memory Location | D | D' |
|---|---|---|
| 0 | 0000 | 1111 |
| 1 | 0000 | 1111 |
| 2 | 1111 | 0000 |
| 3 | 1111 | 0000 |
| 4 | 0000 | 1111 |
| 5 | 0000 | 1111 |
| 6 | 1111 | 0000 |
| 7 | 1111 | 0000 |

Fig. 6D

4th ADB
(using LFSR[0] bit value)

| Memory Location | D | D' |
|---|---|---|
| 0 | 0000 | 1111 |
| 1 | 1111 | 0000 |
| 2 | 0000 | 1111 |
| 3 | 1111 | 0000 |
| 4 | 0000 | 1111 |
| 5 | 1111 | 0000 |
| 6 | 0000 | 1111 |
| 7 | 1111 | 0000 |

BUILT-IN SELF TEST CIRCUIT EMPLOYING A LINEAR FEEDBACK SHIFT REGISTER

BACKGROUND OF THE INVENTION

1. Field of the Invention

The present invention relates to a semiconductor testing device and a method for testing semiconductor memories; in particular a device and method having a built-in self-tester and a linear feedback shift register for testing semiconductor memories.

2. Discussion of Related Art

BIST (built-in self test) is a technique for testing embedded memory using a circuit having a test algorithm. A conventional BIST circuit is shown in FIG. 1. As shown, the BIST circuit 100 includes an address generator 120 for generating addresses to access the locations of Memory 150. The Data Generator 120 generates the data to be tested, and a comparator 140 compares data read from Memory 150 against the data written into the memory. BIST controller 110 typically includes a stored program which when executed, applies the proper control signals to the address generator 120, data generator 130, and comparator 140 to test the memory 150. BIST controller 110 also receives the compared data from comparator 140 and determines whether the test has passed or failed.

A March test algorithm is commonly employed as the test algorithm stored in the BIST controller for testing the embedded memory. The March test algorithm implements a test sequence which tests each bit of each location in the memory by causing both a '0' and a '1' value to be written to and read from the memory. The address to the memory are incremented and decremented in sequential order until all locations are tested. The March test sequence is:

$\updownarrow(W_D)\uparrow(R_D, W_{D'})\uparrow(R_{D'}, W_D)\downarrow(R_D, W_{D'})\downarrow(R_{D'}, W_D)\updownarrow(R_D)$ Wherein the symbols ↑, ↓, and ↕ denote directions of counting addresses of: "up" (address increment) "down" (address decrement), and "up or down" (increment or decrement), respectively. The symbols W and R represent writing and reading, respectively. D is a data value, either a 'O' or '1' and D' denotes the opposite of D. $W_D$ means a writing operation with data D and $R_{D'}$ means a reading operation with D'. The parenthesis "( )" denotes the operations which are carried out for all the addresses and if more than one operation is within the parenthesis, both operations are carried out at the same address location. For example, "$(R_D, W_{D'})$" means D is read out of and D' is written into the same location before the address is changed. The March test method detects stuck-at faults at each cell, but cannot detect coupling and address faults. See "An Effective BIST Scheme for Ring-Address Type FIFOs." By Y. Zodan, A. J. Van De Goor, and Ivo Schanstra, IEEE Int. Test Conference, Washington D.C., pp. 378–387, Oct. 1994.

U.S. Pat. No. 5,706,293 to Kim et al. describes a test method which detects address faults and coupling faults in addition to the stuck-at faults detected by the March test algorithm. The addressing described in the '293 Patent is unidirectional (single-order address). The '293 patent describes use of 'Address Data Backgrounds' as test data which tests all memory locations for the above-described faults. The Address Data Backgrounds (ADBs) are pseudo-random data which can be generated by a linear feedback shift register (LFSR). The '293 patent discloses a test pattern of:

$(W_D), (R_D, W_{D'}), (R_{D'}, W_D), (R_D)$.

ADB is defined in the '293 patent as a union of all the data that two (2) random cells having mutually different addresses can have. In the '293 test method, an ADB from a group is selected as an initial data written into all the locations of the memory. Upon reading the ADBs first written into all the locations, the inverse or opposite value of the same ADB is written into all the locations of the memory. Addressing of the memory is by sequential incrementation. The inverted ADB data is read and when the inverted data is correctly read, data from the same ADB group is written to and read from each location of the memory again. These steps are repeated for each of the Address Data Backgrounds. In the '293 test method, counters such as carry propagation adder, carry safe adder, or ripple counter can be used to provide a unidirectional count from zero to the most significant location of the memory. The '293 patent is commonly assigned to the applicant and the disclosure of U.S. Pat. No. 5,706,293 is incorporated by reference herein.

Referring again to FIG. 1, the address generator 120 in BISTs typically is a counter which is capable of repeatedly counting up or counting down sequentially. A sequential up-down counter is used to implement the March test algorithm. An up-down counter sequentially counts up or down by adding or subtracting one to or from the previous count. Propagation half adders are commonly used to add or subtract to the count. This requires propagating a carry from the least significant bit (LSB) to the most significant (MSB) of an address string. The time of propagation of the carry from the LSB to the MSB of all the address bits represent the cycle time which must be allocated for each test cycle of the BIST tester. Thus, the larger the memory capacity, the wider the address, and the cycle time needed for the address generator/counter must necessarily increase.

A problem is encountered when a BIST circuit is used to test a high capacity memory at operational speed, i.e., at the operating speed of the CPU. Recently, CPUs that operate at 1.5 Ghz are widely available. In order to test a high capacity memory at operational speed, the conventional up-down counter cannot be employed because the carry cannot propagate through the entire counter within the cycle time of a CPU cycle at operational speed.

Further, a BIST circuit is typically embedded within the memory on the same chip. To test a higher capacity memory, the address is wider or has more bits and more adders are needed in the up-down counter. This results in an increased size requirement for the BIST circuit, compromising valuable real estate of the semiconductor chip.

Accordingly, a need exists for a BIST circuit and method for testing semiconductor memories which avoid the above-discussed problems. The desired BIST circuit and method should be capable of generating addresses for testing all locations of the memory at normal CPU operational speed and the BIST circuit does not occupy a large chip area.

SUMMARY OF THE INVENTION

According to an aspect of the present invention, a semiconductor device is provided for testing a memory having N locations, the device comprising: a Linear Feedback Shift Register (LFSR) for creating unidirectional pseudo-random ($\log_2 N$)-bit address patterns, the address patterns being used as addresses for memory locations to be tested; a data generator for generating data patterns based on the address patterns generated by the LFSR, said data patterns are grouped into ($\log_2 N$)+1 Address Data Background (ADB) groups, each of the ADB groups having N locations, said data patterns for use as data input to the memory for testing;

a comparator for comparing the data input to the memory against the data output from the memory for data integrity verification; and a built-in self test (BIST) controller, operatively connected to the LFSR, data generator, and comparator, for controlling testing of the memory.

Preferably, the data patterns include in each location data represented by a first logic level during a first test step and a second logic level during a second test step, wherein one of the ADB groups includes data represented by logic level low in the entire width of each location, the entire width being one or more bits.

According to a preferred embodiment of the invention, ($\log_2 N$) groups of the ($\log_2 N$)+1 ADB groups include at each location corresponding to an address generated by the LFSR, data having the same logic level as the logic level of address data in a predefined bit position of the address.

Preferably, each of the succeeding ($\log_2 N$) ADB groups of the ($\log_2 N$)+1 ADB groups is divided into a first subgroup and a second subgroup, wherein locations in the first subgroup are tested with data having a first logic level and locations in the second subgroup are tested with a second logic level. The last of the succeeding ADB groups preferably having data with the first logic level in every other location. Alternatively, locations in each of the succeeding ADB groups are divided into two subgroups until the last of the ADB groups has N subgroups.

The BIST controller according to an aspect of the present invention includes stored program codes which when executed, applies the addresses generated by the LFSR in a predefined sequence, wherein one predefined sequence is:

$W_D$, ($R_D$, $W_D'$), ($R_D'$, $W_D$), $R_D$.

A method according to the present invention is also provided for testing a memory having N locations embedded in a semiconductor device, comprising the steps of: creating unilateral pseudo random ($\log_2 N$)-bit LFSR address patterns using a LFSR, the LFSR address patterns for use as addresses for addressing locations of the memory to be tested; generating data patterns for use as test data for inputting to locations of the memory addressed by the LFSR address patterns, the test data being based on address data of the LFSR address patterns.

The method preferably includes test data represented by a logic level which is the same as the logic level of a predefined bit of a corresponding LFSR address pattern.

The method according to a preferred embodiment of the invention further includes the step of grouping the data patterns in ($\log_2 N$)+1 ADB groups, wherein each of ($\log_2 N$) ADB groups of the ($\log_2 n$)+1 ADB groups is further divided into two subgroups, one subgroup having a low logic level data and the other subgroup having a high logic level. The last of the ($\log_2 N$) ADB has N subgroups.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 4 is table showing the relationship between the number of bits of LFSR counters and corresponding primitive polynomial.

FIGS. 6A, 6B, 6C and 6D show the four (4) ADB groups of the illustrative embodiment of the present invention.

DETAILED DESCRIPTION OF PREFERRED EMBODIMENTS

A BIST circuit according to an embodiment of the present invention employs an LFSR to generate ADBs for providing addresses for testing an embedded memory. Test data written to and read from the memory are also ADB based. The BIST circuit implements a unidirectional test algorithm to test the memory.

Figure 1:
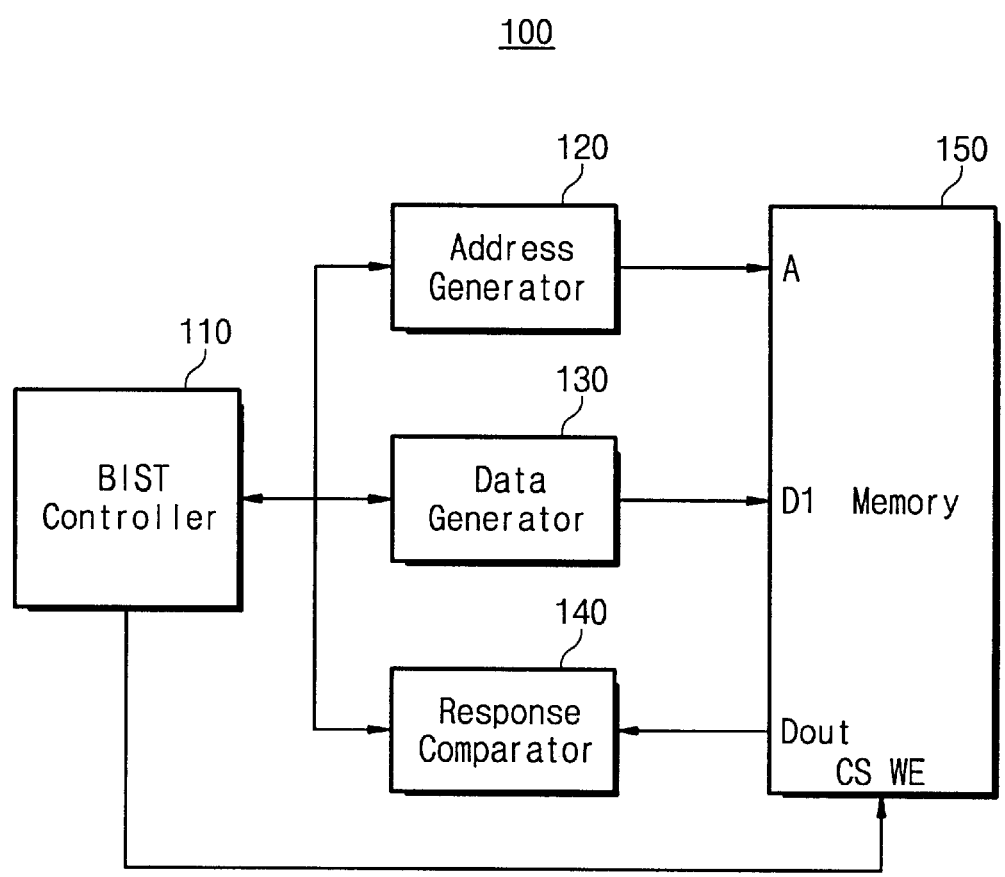
FIG. 1 is blocked diagram of a conventional BIST circuit.
Figure 2:
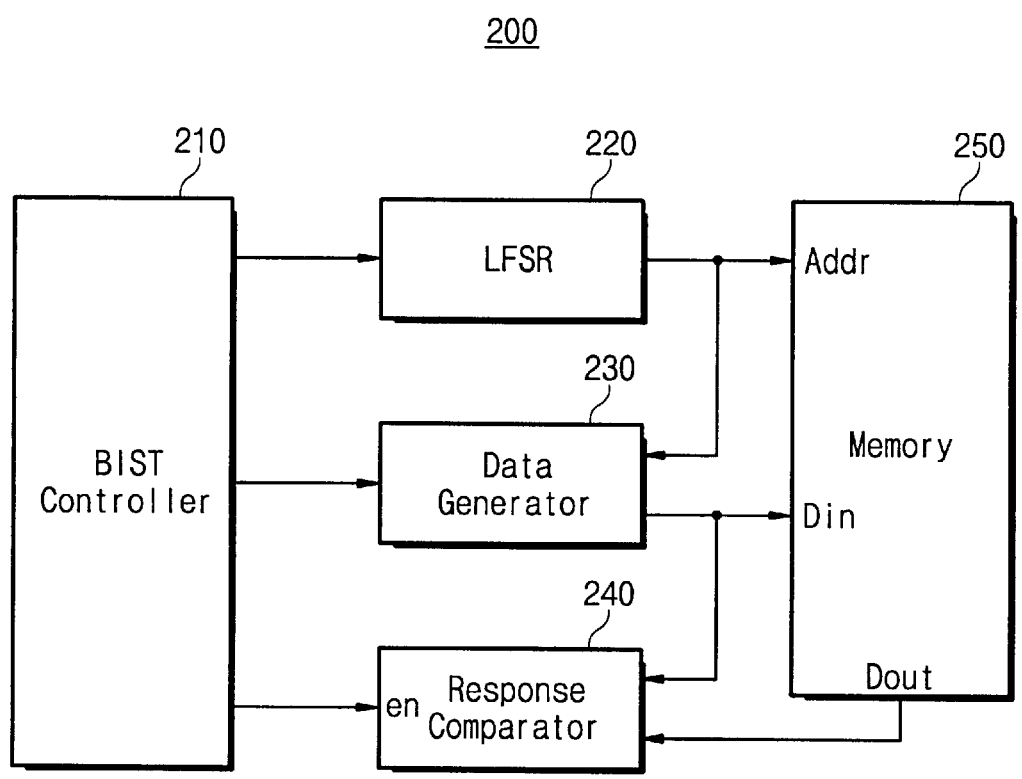
FIG. 2 is a simplified block diagram of a BIST circuit according to an embodiment of the present invention.

FIG. 2 is a simplified block diagram of a BIST circuit according to the present invention. BIST circuit 200 includes an LFSR 220 for generating pseudo-random, unidirectional addresses to memory 250. Data generator 230 generates data background which is at least partially derived from the address data generated from the LFSR 220. The data background from data generator 220 is the test data input to memory 250. Comparator 240 receives the same data written to memory 250 and compares the input data against data read from the memory. BIST controller 210 contains a stored test algorithm for implementing the memory test. Controller 210 controls the operations of LFSR 220, data generator 230, and receives the compared results from comparator 240.

Figure 3A:
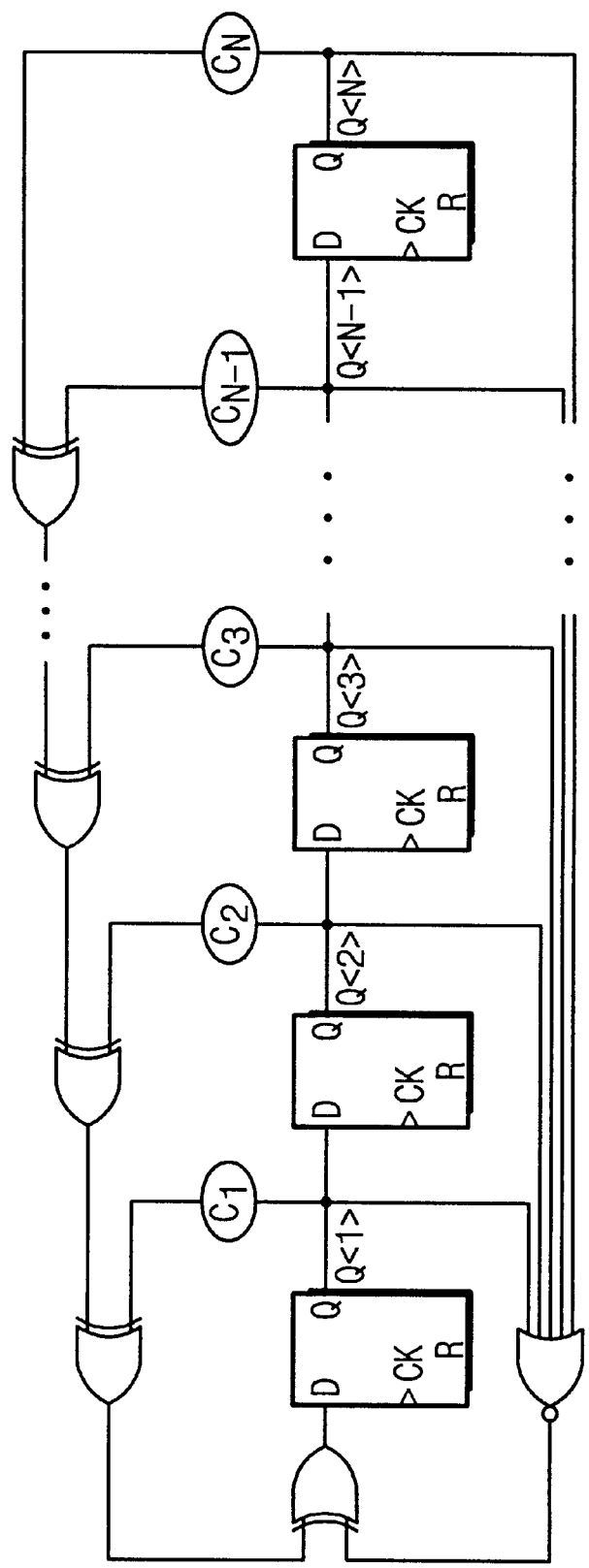
FIGS. 3A and 3B are schematic diagrams of LFSR circuits.
Figure 3B:
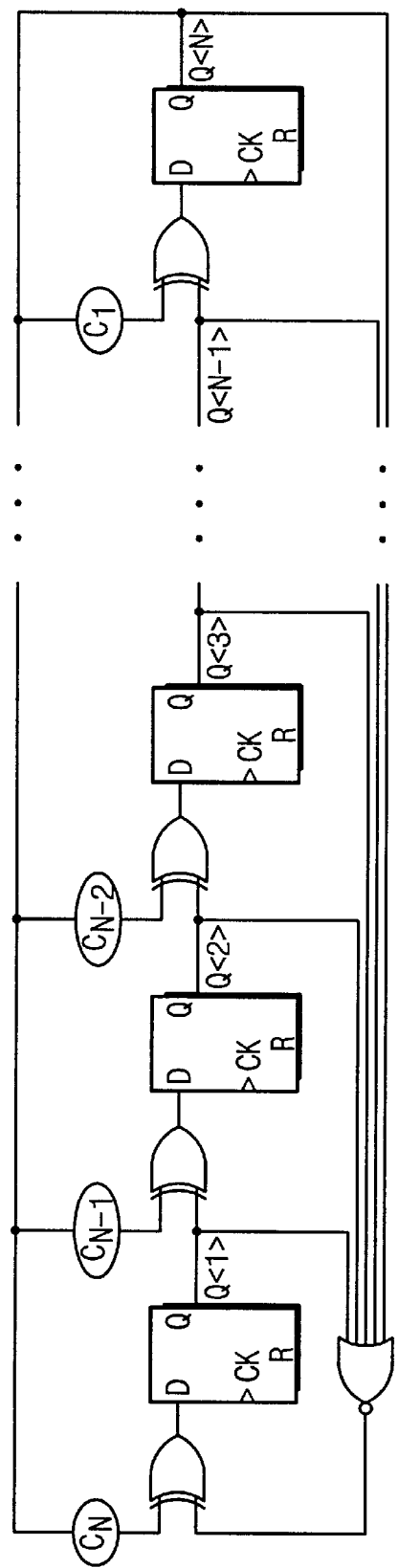

FIGS. 3A and 3B depict exemplary LFSR circuits for generating ADBs according to preferred embodiments of the present invention. The LFSRs include flip-flops or registers, exclusive-OR and/or exclusive-NOR and NOR-gates, interconnected to feedback the outputs of succeeding registers to the initial register. The LFSRs output a pseudo-random bit pattern at $C_1$ to $C_N$ dependant upon the combinatorial connection of the XOR and NOR gates. The bit pattern output at $C_1$ through $C_N$ will repeat counting in order and the count pattern repeat at each $2^N$ count. For example, for a 4-bit LFSR, N=4 and the count pattern repeats at every $2^4$ or 16 counts. The count pattern also relates to a primitive polynomial, which is established in accordance with a desired number of bits of the LFSR. FIG. 4 lists the primitive polynomial corresponding to various bit numbers. The pseudo-random pattern generated by the LFSR is unidirectional. For example, an address count of 1-3-5-7-9-2-4-6-8 is repeatable but cannot be reversed to count in the order of 8-6-4-2-9-7-5-3-1, as is possible in the March test algorithm.

Figure 5:
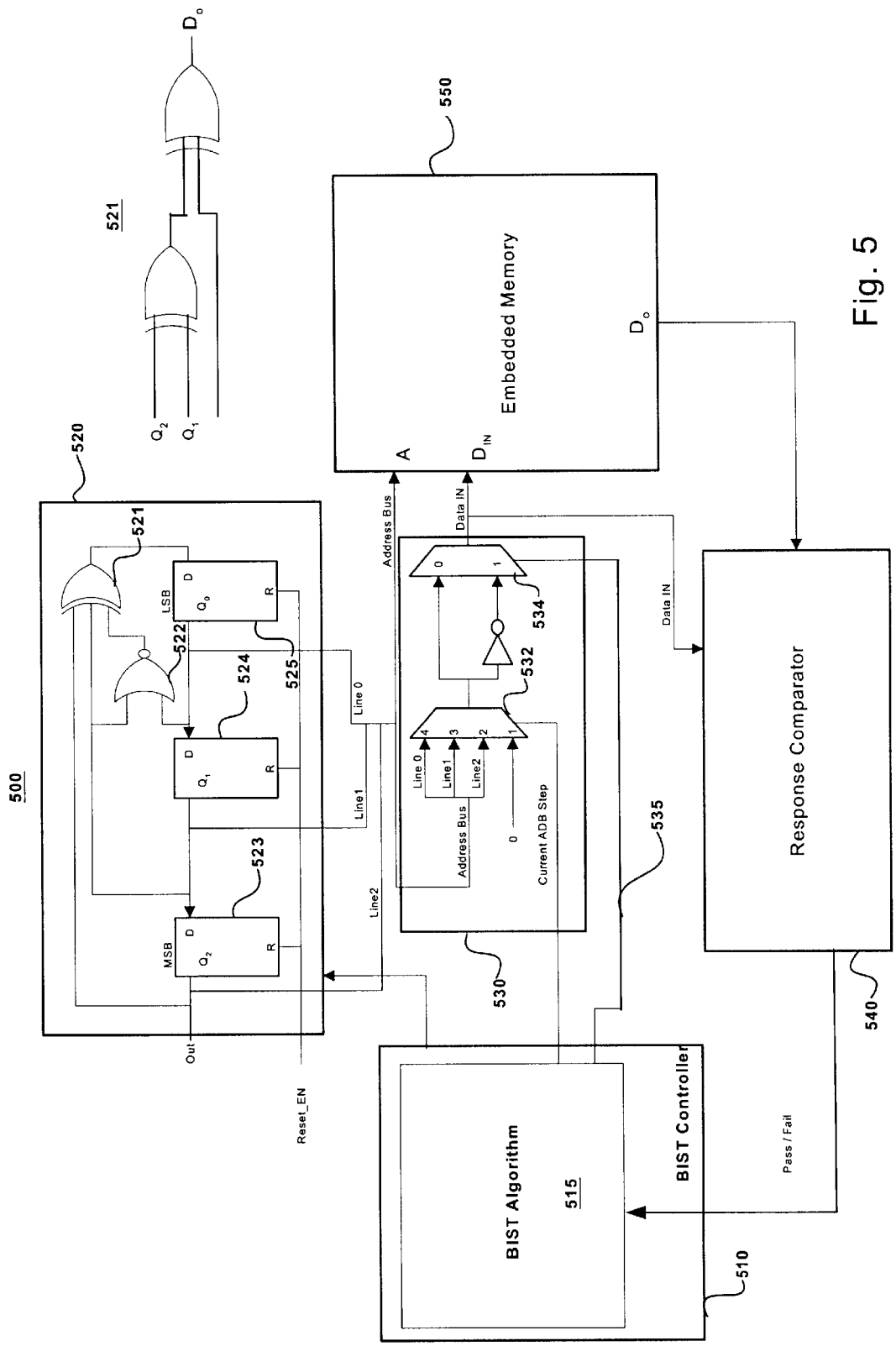
FIG. 5 is a block diagram of a BIST circuit according to an illustrative embodiment of the present invention.

FIG. 5 shows a block diagram of a BIST circuit according to a preferred embodiment of the present invention. BIST circuit 500 includes a LFSR counter 520 for providing addresses for testing memory 550. LFSR counter 520 includes shift registers 523, 524, 525 and XOR gate 521 and NOR gate 522. The outputs of the shift registers are feedback through the XOR and NOR gates to the input of register 525. It is readily apparent to one ordinarily skilled in the art that although a three-bit LFSR counter is shown according to this embodiment, the BIST circuit of the present invention is applicable to any number of bits, depending upon the capacity of the memory to be tested. In this illustrative embodiment, eight (8) locations in memory 550 are tested. And, for purposes of illustration, the memory data is four (4) bits wide.

It is also readily apparent to one ordinary skilled in the art that XOR-gate 521, a 3-input XOR-gate, is functionally equivalent and preferably implemented as two 2-input XOR-gates connected in series as shown in FIG. 5. LFSR counter 520 outputs in order an address pattern of "000", "001", "010", "101", "011", "111", "110", and "100", or locations "0, 1, 2, 5, 3, 7, 6, and 4." That is, the LFSR counter can start its count at any of the eight (8) addresses but once started at a particular address, the succeeding address counts will follow the same order. The output of "000" can be selected regardless of count order by activating the reset line Reset-EN. It can be seen that all eight (8) locations of the memory 550 are addressed by the LFSR counter 520.

Although the address count output by LFSR counter 520 is unidirectional, the BIST circuit according to the present invention is capable of detecting the stuck-at faults, transition faults, address faults and coupling faults of the memory. The data pattern generated by data generator 530, coupled with the LFSR addressing, accomplishes the above fault detections. Data generator 530 generates data transitions for each cell of the memory from both directions by making use of the Address Data Backgrounds (ADBs) generated from the LFSR counter. According to a preferred embodiment of the present invention, for every N locations of memory to be tested, the number of address bits referred to be generated by the LFSR counter is $\log_2 N$ and, $(\log_2 N)+1$ ADB groups are used as data for testing the memory. For the present illustrative embodiment, the number of locations of memory to be tested, N, is equal to eight (8). The number of address bits is $\log_2(8)$ or 3 and there are $\log_2(8)+1$ or 4 ADB groups generated. Data generator 530 generates the four (4) groups of ADBs as shown in FIG. 6. The ADBs shown in FIG. 6 are the actual data written into the eight (8) locations to be tested in memory 550. The ADBs are generated by data generator 530. According to a preferred embodiment of the present invention, the ADBs are derived from the address data generated by LFSR counter 520 as follows:

The first ADB group will be all "0s" and the inverse D' would be all "1s," regardless of the address from LFSR counter 520. This is shown in FIG. 6A. Each of the other ADB groups derives data from a respective data bit of the address. For example, the second ADB group derives its data from the value of the second bit address LFSR [2] from LFSR counter 520 (FIG. 6B). The other three (3) bits of the four (4) bit data in each location of the memory is copied as well from LFSR [2]. Therefore, each test data input to each memory location is either four (4) bits of "0s" or "1s." For example, when LFSR address count is "101", the LFSR [2] has a value of "1". The data generator 530 will then generate a "1111" as data for address "101", to be input to location 5 of memory 550. When all eight (8) locations of memory 550 are written with data from the $2^{nd}$ ADB group in the order of the address count output from LFSF counter 520, i.e., locations "0,1,2,5,3,7,6, and 4," the eight (8) locations of memory (locations 0 to 7) will be written with the second ADB data pattern as shown in FIG. 6B. In like manner, the third ADB data are generated by copying the value of LFSR of the first bit, LFSR [1], of the address pattern output from LFSR counter 520. Likewise, the fourth ADB is generated by copying LFSR [0] to produce the data pattern as shown in FIG. 6D.

As can be seen from FIGS. 6A to 6D, the first ADB group of FIG. 6A has all "0s" as D data and all "1s" as D' data. Each of the succeeding ADB groups has all "0s" or all "1s" as D data divided into at least one subgroup, wherein each subgroup has either all "0s" or all "1s" as the D data. The number of subgroup locations having all "0s" or all "1s" D data increases for each succeeding ADB group, until in the last ADB group the D data is either all "0s" or all "1s" in every other location. Using the test data of FIGS. 6A to 6D, every cell in the memory is tested with the toggling of "0" to "1" and "1" to "0" from both directions.

Data generator 530 includes a multiplexer 532 for multiplexing the selected ADB to pass through the value of data which is the same as the data of LFSR [2, 1, or 0], depending on the selection signal output from BIST controller 510. Multiplexer 534 selects the data D or the inverse of data D, D' as output of data generator 530 for inputting as test data to the location address by LFSR counter 520 in memory 550. To generate the $2^{nd}$ ADB group as shown in FIG. 6B, BIST controller 510 executes BIST algorithm 515 and selects line 2 of multiplexer 532 via select signal 537. To generate four (4) bits of equal value, four (4) latches (not shown) may be used at port 2 to receive LFSR [2] and output four (4) bits of the same value. The four (4) bit data is then passed through or inverted in multiplexer 534 under control of BIST controller 510. The response comparator 540 receives, under control of BIST controller 510, test data from data generator 530 and data read from memory 550. The comparator 540 compares the test data against the corresponding data read and forward a pass/fail signal to BIST controller 510 by checking whether the data input and output to and from memory 550 are matched.

Figure 7:
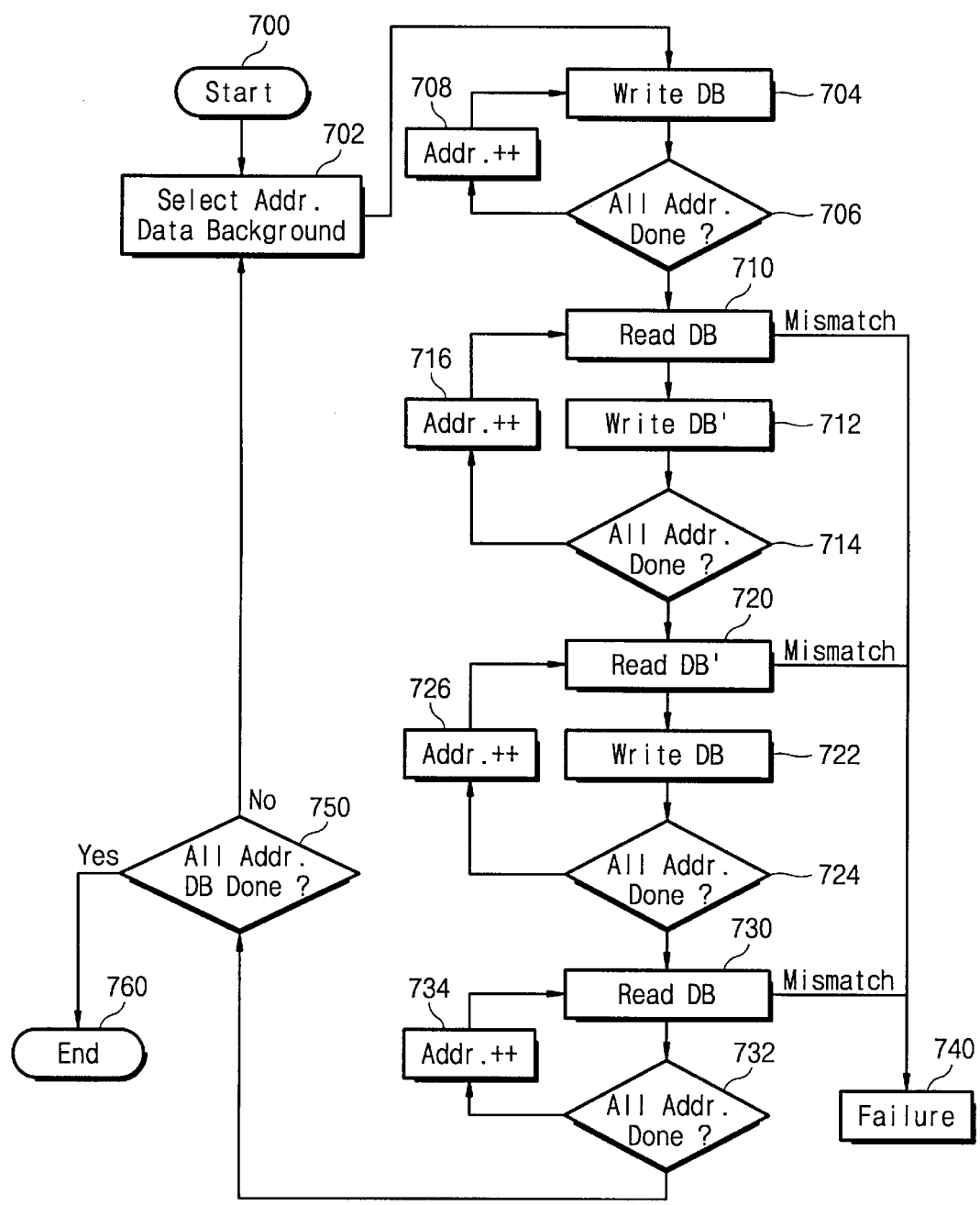
FIG. 7 is a flow diagram of a test process implemented by a BIST of the present invention.

BIST controller 510 includes a stored BIST algorithm 515, which when executed, implements the stored test sequence. FIG. 7 shows a test algorithm according to a preferred embodiment of the present invention performed by BIST circuit 500. In operation, BIST controller 510 selects an Address Data Background group and an LFSR address to begin test of the memory cells of 550 (Step 702). For purposes of illustration, address "000" and the $2^{nd}$ ADB group of FIG. 6B is selected initially. The first ADB data of '0000' is written into address location zero (0) of memory 550 (704), the next address count is '001' or location one (1). The LFSR [2] is zero (0) and location one (1) of memory 505 is written with '0000.' Then the next address count is '010' or location two (2), which will be written with LFSR [2]=D, or '0000.' This writing of ADB data continues until data of the entire ADB group is written into all eight (8) locations to be tested in memory 550 (706, 708). The eight (8) locations of memory 550 should now have all data 'D' written as shown in FIG. 6B. Then data of the $2^{nd}$ ADB group is read from memory 550 (710) and the inversion of the data, D' is written into the same location just read prior to the next address increment (712). The data of the $2^{nd}$ ADB group is read and written until all locations have been addressed (714, 716). Then if there is a mismatch in any of the data read in Step 710, comparator 540 will signal to BIST controller 510 that a failure has occurred at that address location. If there is no mismatch, BIST controller 510 then selects a different ADB group for inputting a different data pattern to the locations of memory 550. BIST controller 510 sends ADB select signal 537 to pass through a different LFSR [N] data. For illustration in this case, the third ADB group shown in FIG. 6C is selected to pass through the value of Line 1 in data generator 530 to pass through LFSR [1]. The data of the $3^{rd}$ ADB group is written into the locations of memory 550 while D' of the $2^{nd}$ ADB group is read from the same locations addressed by LFSR counter 520 (720, 722). The read D' and write D process is repeated for each address count in Steps 724 and 726. Then D' of the $3^{rd}$ ADB group is read from all locations (Steps 730, 732, 734). Steps 704 to 754 are repeated until all data of all four (4) ADB groups are written and read from memory 550 (750). The test sequence of FIG. 7 can be described as:

$W_D$, $(R_D, W_{D'})$, $(R_{D'}, W_D)$, $R_D$.

The memory 550 is tested for stuck-at, transition, cross-coupling and address faults if no mismatch is reported from comparator 540.

The invention has been described using exemplary preferred embodiments. However, it is to be understood that the scope of the invention in not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device for testing a memory having N locations, the device comprising:

a linear feedback shift register (LFSR) for creating unilateral pseudo-random ($log_2N$)-bit address patterns, the address patterns being used as addresses of memory locations to be tested;

a data generator for generating data patterns based on the address patterns generated by the LFSR, said data patterns are grouped into ($log_2N$)+1 Address Data Background (ADB) groups, each of the ADB groups having N locations, said data patterns for use as data input to the memory for testing;

a comparator for comparing the data input to the memory against the data output from the memory for data integrity verification; and a built-in self test (BIST) controller, operatively connected to the LFSR, data generator, and comparator, for controlling testing of the memory.

2. The device of claim 1, wherein the data patterns include in each location data represented by a first logic level during a first test step and a second logic level during a second test step.

3. The device of claim 1, wherein one of the ADB groups includes data represented by logic level low in the entire width of each location, the entire width being one or more bits.

4. The device of claim 1, wherein ($log_2N$) groups of the ($log_2N$)+1 ADB groups include at each location corresponding to an address generated by the LFSR, data having the same logic level as the logic level of address data in a predefined bit position of the address.

5. The device of claim 1, wherein each of the succeeding ($log_2N$) ADB groups of the ($log_2N$)+1 ADB groups is divided into a first subgroup and a second subgroup, wherein locations in the first subgroup are tested with data having a first logic level and locations in the second subgroup are tested with a second logic level.

6. The device of claim 5, wherein the last of the succeeding ADB groups has data having the first logic level in every other locations.

7. The device of claim 5, wherein locations in each of the succeeding ADB groups are divided into two subgroups until the last of the ADB groups has N subgroups.

8. The device of claim 1, wherein the BIST controller includes stored program codes which when executed, applies the addresses generated by the LFSR in a predefined sequence.

9. The device of claim 8, wherein the predefined sequence is:

$W_D$, ($R_D$, $W_{D'}$), ($R_{D'}$, $W_D$), $R_D$.

10. A method for testing a memory having N locations embedded in a semiconductor device, comprising the steps of:

creating unilateral pseudo random ($log_2N$)-bit LFSR address patterns using a LFSR, the LFSR address patterns for use as addresses for addressing locations of the memory to be tested; and generating data patterns for use as test data for inputting to locations of the memory addressed by the LFSR address patterns, the test data being based on address data of the LFSR address patterns.

11. The method according to claim 10, wherein the test data includes data represented by a logic level which is the same as the logic level of a predefined bit of a corresponding LFSR address pattern.

12. The method according to claim 10, further including the step of grouping the data patterns in ($log_2N$)+1 ADB groups, wherein each of ($log_2N$) ADB groups of the ($log_2N$)+1 ADB groups is further divided into two subgroups, one subgroup having a low logic level data and the other subgroup having a high logic level.

13. The method according to claim 12, wherein the last of the ($log_2N$) ADB has N subgroups.

* * * * *